US 6,574,762 B1

(12) United States Patent
Karimi et al.

(10) Patent No.: US 6,574,762 B1
(45) Date of Patent: Jun. 3, 2003

(54) USE OF A SCAN CHAIN FOR CONFIGURATION OF BIST UNIT OPERATION

(75) Inventors: Farzin Karimi, Roslindale, MA (US); Thompson W. Crosby, San Jose, CA (US); V. Swamy Irrinki, Milpitas, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/540,197

(22) Filed: Mar. 31, 2000

(51) Int. Cl.[7] .............................................. G01R 31/28
(52) U.S. Cl. ...................................................... 714/727
(58) Field of Search .............................. 714/726, 727, 714/733, 734, 735, 824, 731, 744

(56) References Cited

U.S. PATENT DOCUMENTS

| | | | | |
|---|---|---|---|---|
| 5,570,375 A | * | 10/1996 | Tsai et al. ...................... | 714/30 |
| 5,742,617 A | * | 4/1998 | Warren ......................... | 714/726 |
| 5,805,608 A | * | 9/1998 | Baeg et al. .................... | 714/726 |
| 6,141,790 A | * | 10/2000 | Beausang et al. .............. | 703/16 |
| 6,408,413 B1 | * | 6/2002 | Whetsel ......................... | 714/727 |

OTHER PUBLICATIONS

*Introduction to JTAG Boundary Scan*, microSPARC–IIep™, Sun Microelectronics, Jan. 1997 (12 p.).
*TAP master instructions for programmers*, M. Smith, Dec. 23, 1999 (6 p.).

* cited by examiner

Primary Examiner—Albert Decady
Assistant Examiner—Matthew C. Dooley
(74) Attorney, Agent, or Firm—Conley, Rose & Tayon

(57) ABSTRACT

An integrated circuit device is disclosed having a boundary scan chain and a hardwired BIST unit that is configurable via the control circuitry for the boundary scan chain. In one embodiment, the device includes application logic, a BIST unit, a boundary scan chain, a register, and a test access port. The application logic is the logic that provides the intended function of the chip. The BIST unit is configured to apply test patterns to the application logic to verify its functionality. The boundary scan chain is configured to sample input signals to the application logic and to control output signals from the application logic. The register stores an operational mode parameter for the BIST. The test access port provides external access to the boundary scan chain and the register, and is configured to control a clock signal to the BIST unit in accordance with the BIST operational mode parameter.

9 Claims, 3 Drawing Sheets

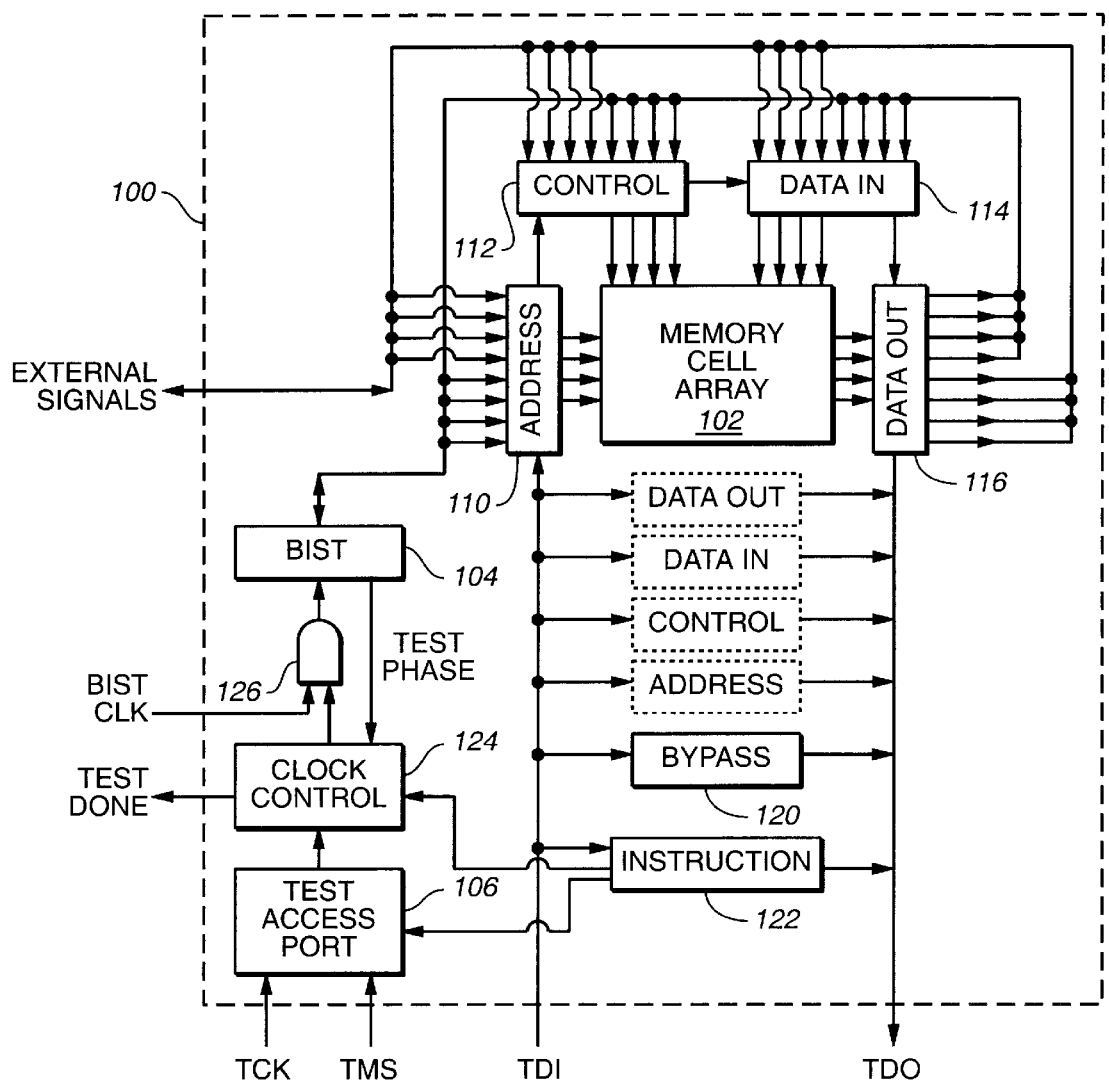
FIG._1

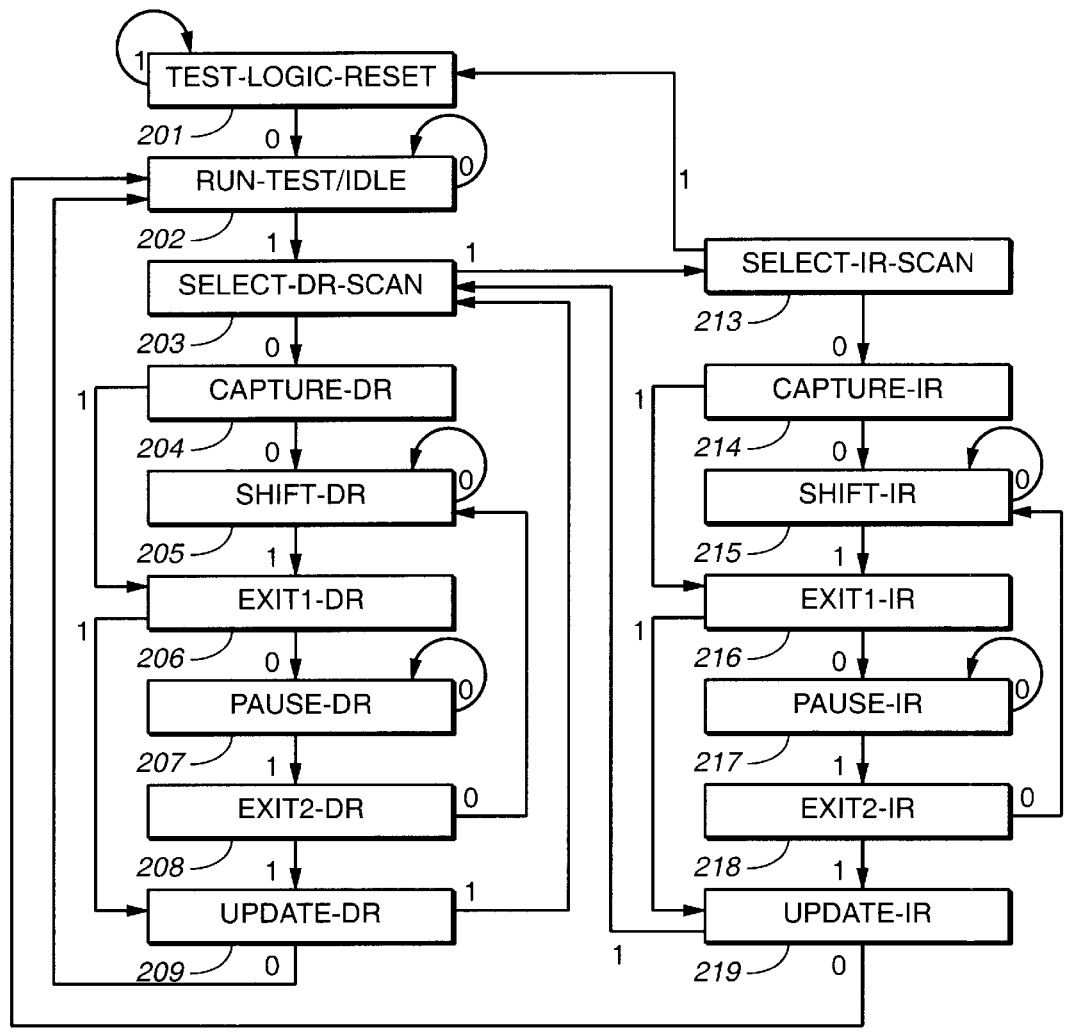
FIG._2

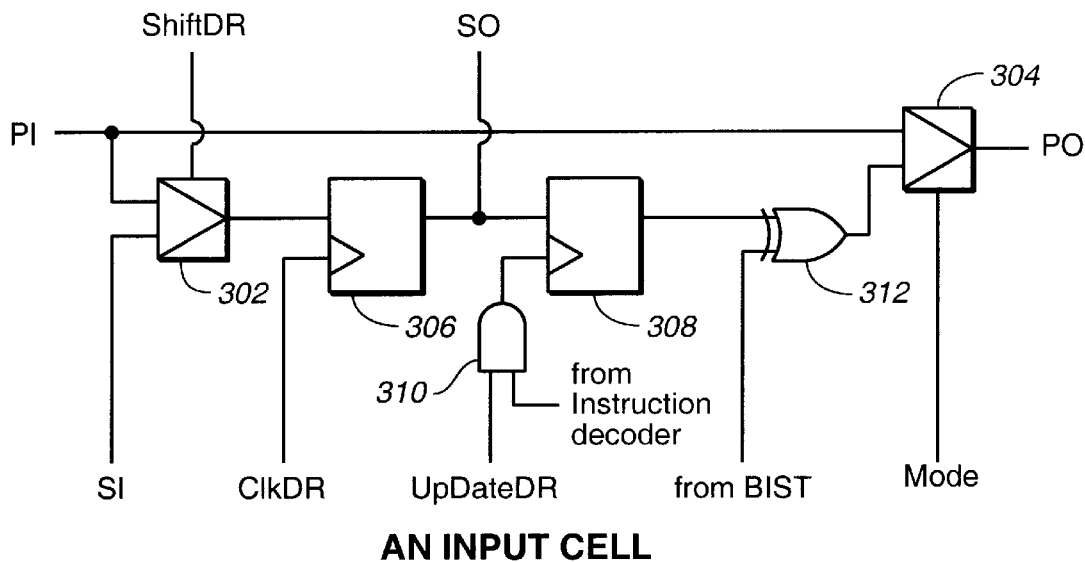
AN INPUT CELL
FIG._3
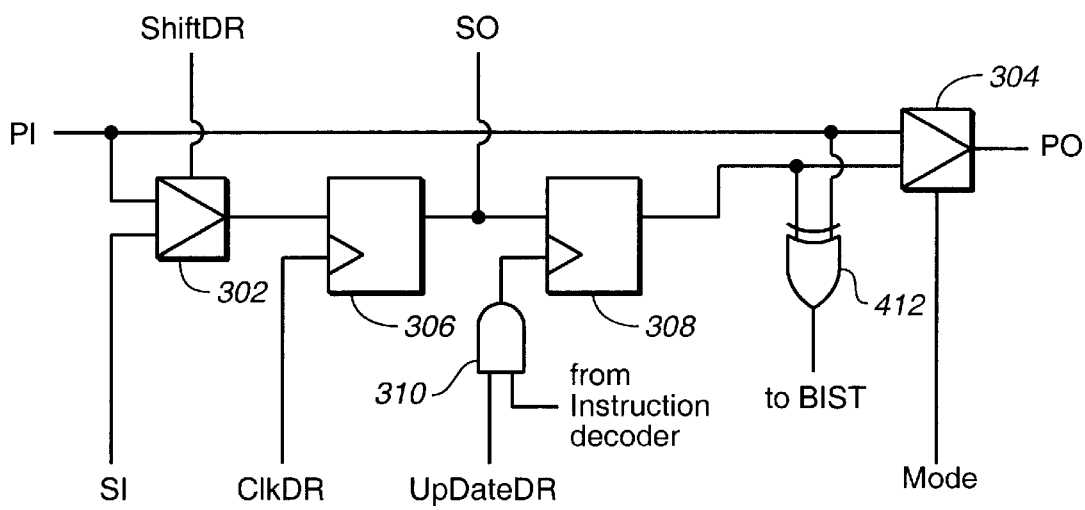
AN OUTPUT CELL
FIG._4

USE OF A SCAN CHAIN FOR CONFIGURATION OF BIST UNIT OPERATION

BACKGROUND OF THE INVENTION

1. Field of the Invention

This invention generally relates to the field of digital electronic device testing, and particularly relates to methods and apparatuses using a scan chain to configure the operation of a built-in self-test unit.

2. Description of the Related Art

Since users generally depend upon the reliability of memory chips and other integrated circuits for their own systems to function properly, it is common practice for the chip manufacturers to test the functionality of chips at the manufacturing site before the chips are sold to users. The manufacturers' reputations depend upon the reliability of their chips. As the line width within an integrated circuit chip continues to shrink, this reliability becomes more difficult to achieve. An ongoing challenge for the chip manufacturers is to increase the number and density of transistors on a chip without sacrificing reliability or suffering decreasing chip yields due to malfunctioning parts.

Before the chips are released for shipment, they typically undergo testing to verify that the circuitry for each of the major on-chip modules is functioning properly. One standard way for testing chips involves using an external memory tester or Automatic Test Equipment (ATE) at the manufacturing site. An external memory tester supplies power and applies test patterns to the chip to detect faults. External testers can only test a limited number of chips at a time, and the test speed is limited by the external bus speed. Consequently, this method of testing is expensive in terms of time requirements and equipment costs.

Partly to address these issues, and partly to provide off-site testing, built-in self-test (BIST) units are now commonly incorporated into memory chips and other integrated circuits. Automated test equipment can now be simplified to the extent that the only necessary functions are to supply power (and sometimes a clock signal) to the chip, and to monitor a single output signal from the chip. The on-chip BIST unit generates all the test patterns and asserts (or de-asserts) the output signal if the chip passes the functionality test. The BIST can be configured to run every time the chip is powered-on, or the BIST may be configured to run only when a test mode signal is asserted.

A memory BIST unit operates by writing and reading various patterns to/from the memory to determine various kinds of memory faults. In general, a memory BIST unit writes a data value to a memory cell and subsequently reads the memory cell. By comparing the data written and the data subsequently returned from the memory cell, the memory BIST unit is able to determine whether the memory cell is faulty. If too many errors are detected, then the fault may exist in the support circuitry for the memory cell array.

Many algorithms have been developed for detecting memory faults. The most popular algorithms are the March C algorithm and its variants such as the March C+, Smarch, or March LR algorithms. The March C algorithm may be divided into six phases. In each phase, each of the memory addresses are individually accessed.

Phase 1 of the March C algorithm writes an initial test pattern into the cells. The initial test pattern may be any desired sequence of bits, such as a "checkerboard" pattern, but often simply comprises all 0's. The initial test pattern values can be written in any order, although the cells usually are addressed consecutively from address 0 to address N−1 (forward) or from address N−1 to address 0 (backward), where N represents the number of addresses in the memory. Phases 2–5 also address each cell consecutively, executing a read operation immediately followed by a write operation at each address. Phases 2 and 3 address the memory in the forward direction from address 0 to address N−1, while phases 4 and 5 address the memory in the reverse direction. The first operation at each address in these phases is a read operation to verify the pattern value that was written during the previous pass. If the read operation does not return the value that was previously written, then a fault is detected. Otherwise, a write operation is performed immediately after the read operation to invert the data pattern. In phase 6, each of the cells are read to verify the pattern values written during phase 5.

Thus, BIST units are commonly included in many types of integrated circuits such as memories and operate accordingly to some predetermined algorithm to verify the functionality of the internal chip circuitry. However, electronic devices typically comprise more than the internal circuitry of a single chip. Normally they are constructed from many integrated circuit chips and many support components mounted on a circuit board.

The circuit board normally has etched conductive paths that connect the chip pins and component leads in a pattern designed to create the necessary circuits to form a complete electronic device. Solder or some other conductive adhesive couples the pins and leads to the conductive paths on the circuit board. Even if each integrated circuit and support component is verified before placement on the circuit board, there are still numerous board-level opportunities for electronic device failure. For example, the components may be damaged during the mounting procedure, breaks may occur in the conductive paths, and mechanical stress may break the adhesive coupling to the conductive paths.

As an alternative to laborious (and expensive) pin-by-pin functionality and connectivity testing, a boundary scan technique has been developed by the Joint Test Access Group (JTAG) and standardized by the Institute of Electrical and Electronic Engineers as IEEE 1149.1 "IEEE Standard Test Access Port and Boundary Scan Architecture". The essence of this standard is that each integrated circuit on the circuit board will be equipped with an externally accessible boundary scan chain and standardized control circuitry. The standardized control circuitry is herein referred to as the "test access port".

The boundary scan chain consists of boundary scan cells coupled in sequence around the "boundary" of the chip. Each pin of the chip is coupled via standard driver or buffer circuitry to a respective boundary scan cell, and from there to the internal logic of the chip. The boundary scan cells each include a shift register cell and a latch register cell. The shift register cell is coupled to the shift register cells of preceding and subsequent boundary scan cells. Together they form a shift register that allows information to be serially passed into and out of the boundary scan chain. The latch register cell is coupled to the shift register cell to provide its contents to the shift register cell and to subsequently receive and store the contents of the shift register cell. Together, the latch register cells form a latch register that can set the contents of the shift register and subsequently, after shifting has occurred, store and hold the contents of the shift register. The latch register cells can be further configured (for input pins) to capture the signals of their respective pins and (for output pins) to drive their contents as signals on their respective pins.

The boundary scan chain allows for external control and examination of individual pin states of the integrated circuits chips in digital electronic devices. Integrated circuit chips that comply with this standard have a set of four dedicated pins for carrying out this external control and examination. These pins are labeled Test Data In (TDI), Test Data Out (TDO), Test Mode Select (TMS), and Test Clock (TCK). Data can be serially shifted into the boundary scan chain via the TDI pin. Data can be serially shifted from the boundary scan chain via the TDO pin. The integrated circuit chips may be wired into a single boundary scan chain by coupling the TDO pin of one to the TDI pin of the next. The TMS and TCK pins are used to drive the standardized control circuitry that operates the boundary scan chain. All the integrated circuit chips coupled to form a single boundary scan chain can be driven in parallel by shared TMS and TCK signals. These signals and the standardized control circuitry will be described below in greater detail.

In effect, a hierarchy has developed, with the use of BIST units for testing internal circuitry and the use of boundary scan chains for testing off-chip, board-level circuitry. BIST units typically consist of hardwired circuitry that can operate at very high clock rates and that requires only a small amount of chip area. Unfortunately, hardwired circuits provide very little flexibility. When a new and unforeseen fault occurs, the BIST is of no use in locating and identifying the fault. Boundary scan chains, however, are externally accessible and generally controlled by software. Consequently when unexpected board-level faults occur, the boundary scan chain software can easily revised to locate and identify the fault, and to screen for the fault in other boards. It would be desirable to provide a BIST unit having such access and flexibility, without losing the existing advantages of high speed and small area requirements.

SUMMARY OF THE INVENTION

Accordingly, there is disclosed herein an integrated circuit device having a boundary scan chain and a hardwired BIST unit that is configurable via the control circuitry for the boundary scan chain. In one embodiment, the device includes application logic, a BIST unit, a boundary scan chain, a register, and a test access port. The application logic is the logic that provides the intended function of the chip, e.g. a memory. The BIST unit is configured to apply test patterns to the application logic to verify its functionality. The boundary scan chain is configured to sample input signals to the application logic and to control output signals from the application logic. The register stores an operational mode parameter for the BIST. The test access port provides external access to the boundary scan chain and the register, and is configured to control a clock signal to the BIST unit in accordance with the BIST operational mode parameter. The operational mode parameter may be set to allow step-by-step application of the test pattern, phase-by-phase application, or full application. In those modes where breakpoints are provided, the test access port may be used to access the boundary scan chain and register to alter the test pattern. Preferably, the boundary scan chain is also divided into portions that may be individually accessed without disturbing the bulk of the boundary scan chain, e.g. address portion, control portion, and data portion. This may advantageously lower the overhead required for customizing the test pattern. Also disclosed herein is a method for using such a configuration to verify the functionality of the application logic.

BRIEF DESCRIPTION OF THE DRAWINGS

Other objects and advantages of the invention will become apparent upon reading the following detailed description and upon reference to the accompanying drawings in which:

FIG. 1 depicts a functional block diagram of a memory equipped with a BIST unit and a boundary scan chain according to one embodiment;

FIG. 2 depicts a state diagram for test access port (TAP) control circuitry;

FIG. 3 depicts an exemplary embodiment of a modified boundary scan chain cell for input pins; and FIG. 4 depicts an exemplary embodiment of a modified boundary scan chain cell for output pins.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Turning now to the figures, FIG. 1 shows a memory 100 having memory cell array 102, a BIST unit 104, and a test access port (TAP) 106. The memory has a set of signal lines (collectively labeled EXTERNAL SIGNALS) that include an address bus, a control bus, a data-in bus and a data-out bus. BIST unit 104 provides a second set of signal lines that it controls to perform a test of the memory cell array 102. It is noted that memory cell array 102 is assumed to include normal support circuitry such as an address decoder and read/write sense amplifiers.

A boundary scan chain is positioned around the memory cell array 102 to capture and control the signal buses. The scan chain is composed of individual scan cells. In addition to the standard scan cell functions specified by the IEEE standard 1149.1, the scan cells are preferably also provided with a logical XOR function that allows them to put out the inverse of the signals they receive when their latched contents are nonzero.

Referring momentarily to FIG. 3, the boundary scan chain cells for input pins each include an input multiplexer 302, an output multiplexer 304, a scan register flip-flop 306, a data register flip-flop 308, a masking logic AND gate 310, and a logical XOR gate 312. The chip input pin (PI) is coupled to input multiplexer 302 and output multiplexer 304. In the normal operating mode, the mode signal coupled to the output multiplexer 304 causes the signal value on the input pin signal PI to be provided by multiplexer 304 to the output line (PO).

In addition to the mode signal, The boundary scan chain cell has a scan enable signal ShiftDR, a scan input signal SI, a clock signal ClkDR, an update signal UpdateDR, an optional mask signal from the instruction decoder, and a BIST input signal. The input multiplexer 302 receives the input pin signal PI, the scan input signal SI, and the scan enable signal ShiftDR. When the scan enable signal is asserted, the multiplexer passes on the scan input signal, whereas when the scan enable signal is disabled, the multiplexer passes on the input pin signal PI. The scan flip-flop 306 receives the output of the multiplexer and latches it when the clock signal ClkDR is asserted. The output of the scan flip-flop is a scan output signal that is coupled as the scan input to the next boundary scan chain cell. It is also coupled to the input of the data register flip-flop 308. The data register flip-flop stores the contents of the scan flip-flop 306 when the update signal UpdateDR is asserted. The masking logic gate 310 may be provided to gate the update signal based on bits from the instruction register (described further below). Use of the masking logic is helpful when it is desired to update only a portion of the boundary scan chain without disturbing the rest of the boundary scan chain values, e.g. updating only the data register while leaving the control register unchanged (also described further below).

The contents of the data register flip-flop 308 are provided to the output multiplexer 304 via the XOR gate 312. The other input to the XOR gate is the BIST signal. When the BIST is inactive, the boundary scan chain operates as specified by the IEEE standard 1149.1. However, the XOR gate 312 provides additional functionality to the boundary scan cell in that the contents of the data register flip-flop 308 can be set to selectively invert BIST input signals as they are applied.

FIG. 4 shows a boundary scan cell for output pins. The PI signal is coupled to the output of the circuit under test, and the PO signal is coupled to the output pin of the chip. The components are similar, but the XOR logic gate 412 is configured differently than before. The contents of the data register flip-flop 308 are now used to selectively invert the output signals from the circuit under test on their way to the BIST.

Returning to FIG. 1, the boundary scan chain is organized as an address register 110, a control register 112, a data-in register 114, and a data-out register 116, each coupled to the corresponding signal bus. The registers are coupled serially between TDI and TDO to form a single, long scan register, but as the figure shows in phantom, the registers are also coupled in parallel between TDI and TDO to form individual, short scan registers. Also coupled between TDI and TDO are a bypass register 120, and an instruction register 122. TAP 106, in response to inputs TCK, TMS, and the contents of the instruction register 122, carries out the loading and scanning of the boundary scan chain and the individual registers. These operations are discussed further below.

Although it is standardized, the TAP 106 has sufficient flexibility to provide for the configuration and control of the BIST unit's operation. TAP 106 and instruction register 122 control the operation of BIST 104 via a clock control unit 124 and a BIST clock gate 126.

When enabled, the BIST unit 104 conducts a pattern of read and write operations in response to a BIST clock signal. The read/write pattern is designed to detect faults in the memory cell array 102. During write operations, the BIST unit 104 supplies test data to the memory cell array 102 on the data-in lines. During read operations, the BIST unit 104 receives the actual output data from the memory cell array 102 on the data-out lines and compares it to the expected data. If a mismatch is detected, the BIST unit 104 asserts a fault signal (not specifically shown) and may halt the test.

Most BIST algorithms may be divided into "phases", e.g. the six phases of the March C algorithm described in the background section. The BIST unit 104 reports its progress to the clock control unit 124 using a TEST PHASE signal to indicate the completion of the phases. The clock control unit 124 regulates the progress of the BIST unit through the steps and phases of the algorithm by gating the BIST clock through a BIST clock gate 126. The instruction register 122 preferably includes an operand indicating to the clock control unit 124 whether to operate in a single-step mode, single-phase mode, or complete execution mode. The instruction register 122 may also include bits for setting the boundary chain scan mode to address register scan mode, control register scan mode, data-in scan mode, data-out scan mode, or whole chain scan mode.

Referring momentarily to FIG. 2, a state diagram is shown for TAP 106. The inputs TMS and TCK control the movement through the state diagram. Each arrow is labeled with a value for the TMS input when the TCK signal makes a rising transition. As the transitions occur in the TCK signal, the value of the TMS signal determines the transitions between the states. A sequence of five or more consecutive 1's places the TAP 106 in Test-Logic-Reset state 201. This is also the initial power-up state. In this state, the boundary scan chain is rendered "transparent" to allow normal operation of the chip. The BIST unit 104 also operates normally when the TAP 106 is in this state.

Asserting TMS low during an upward transition of TCK transitions the TAP 106 into Run-Test/Idle state 202. In this state, the TAP 106 performs some operation based on the contents of instruction register 122. Three operations required by the standard are BYPASS, SAMPLE/PRELOAD, and EXTEST. Additional operations are optional. In the present implementation, it is desired to define a RUNBIST operation.

The BYPASS operation keeps the boundary scan chain transparent and couples the 1-bit bypass register 120 between the TDI and TDO pins. This operation is used to bypass the chip and allow rapid movement of data through the bypass register to other chips on the board.

The SAMPLE/PRELOAD operation allows the boundary scan chain to remain transparent, but the boundary scan cells are instructed to sample the current values of their respective lines. The boundary scan chain is coupled between the TDI and TDO pins. It is noted that in the preferred embodiment, various portions or all of the boundary scan chain, as selected by the contents of the BIST parameter register, may be selectively coupled between the TDI and TDO pins by this operation. An operand or another form of this instruction may be used for individually accessing selected portions 110, 112, 114, 116 of the boundary scan chain instead of accessing the boundary scan chain as a whole.

The EXTEST operation places the boundary scan chain in an external test mode. The boundary scan cells corresponding to output lines are configured to drive their latched value onto the output lines. The boundary scan cells corresponding to input lines are configured to sample the signal values of the input lines. The boundary scan chain is coupled between the TDI and TDO pins.

The RUNBIST operation preferably includes one or more operands that specify a BIST operating mode to clock control circuit 124. It is noted that the XOR function of the boundary scan cells affects the BIST operations. The cells appear transparent to the BIST if the cells latched bits are zeros, or they invert the BIST signals if they are holding ones. Each boundary scan cell can be individually configured via the test access port.

The TAP 106 can be held in this state 202 by holding the TMS pin low. Bringing the TMS pin high during an upwards transition of TCK causes a transition to Select-DR-Scan state 203. The data register coupled between the TDI and TDO pins in state 202 (i.e. the boundary scan chain in whole or in part, the parameter register 118, or the bypass register 120) can be accessed by bringing the TMS pin low in this state. This causes a transition to Capture-DR state 204. If instead it is desired to access the instruction register 122, the TMS pin is left high for another clock cycle, causing a transition to Select-IR-Scan state 213.

In Capture-DR state 204, the TAP 106 instructs all the data registers cell to copy the contents of their latch cells to their shift register cells. Asserting the TMS pin high causes a transition to the Exit1-DR state 206, an intermediate state with no effect on the data registers. If the TMS pin is driven low, a transition to the Shift-DR state 205 occurs. Each rising transition of TCK in this state causes the accessed data register to shift the data one bit towards TDO from TDI. Holding the TMS pin low keeps the TAP 106 in this state. Driving the TMS pin high from this state causes a transition to Exit1-DR state 206.

The Exit1-DR state 206 is a decision point between entering a Pause-DR state 207 (with TMS set low) or transitioning to the Update-DR state 209 (TMS set high). The Pause-DR state 207 is simply a pause mechanism that allows shifting of data to be halted midstream indefinitely. Bringing the TMS pin high causes a transition to a second decision point Exit2-DR state 208. Returning the TMS pin low in Exit2-DR state 208 causes the TAP 106 to return to Shift-DR state 205. Holding the TMS pin high in Exit2-DR state 208 causes a transition to the Update-DR state 209.

In the Update-DR state 209, the TAP 106 instructs all the data register cells to copy the contents of their shift register cells to their latch cells. Holding the TMS pin high provides a transition back to the Select-DR-Scan state 203, while taking the TMS pin low provides a transition back to Run-Test/Idle state 202.

Each of the states Select-DR-Scan 203, Capture-DR 204, Shift-DR 205, Exit1-DR 206, Pause-DR 207, Exit2-DR 208, and Update-DR 209 has a corresponding state Select-IR-Scan 213, Capture-IR 214, Shift-IR 215, Exit1-IR 216, Pause-IR 217, Exit2-IR 218, and Update-IR 219 that allows for similar access of the instruction register 122 rather than the selected data register.

Returning to FIG. 1, external configurability of the BIST algorithm may be achieved in the following manner. The BIST unit 104 is designed to execute a predetermined algorithm. The scan chain can be used to alter the BIST operation by changing such things as the initial data pattern and counting direction. The initial data pattern can be changed by scanning in the desired pattern to the data in register 114 (to invert selected bits) and to the data out register 116 (to un-invert the selected bits before the BIST 104 receives them). The counting direction can be changed by scanning all 1's into the address register 110. The clock control unit 124 has an operational mode that is determined by the contents of instruction register 122. (However, TAP 106 forces clock control unit 124 to block the BIST clock while TAP 106 is in states 203–219. The TAP 106 also blocks the BIST clock in state 202 when the instruction register does not have a RUNBIST instruction.) On power-up, the instruction register may possess some power-up defaults which specify the desired default behaviors of clock control unit 124 and BIST unit 104. Preferably, the clock control unit 124 is by default configured to pass the BIST clock, and allow the execution of a complete BIST algorithm by BIST unit 104. Once the BIST unit 104 reports completion or halting of the algorithm, clock control unit 124 asserts the TEST DONE signal.

After power-up, if it is desired to externally configure the BIST operation, the TAP 106 is used to scan in a SAMPLE/PRELOAD operation into the instruction register 122. Then any desired address, control and/or data patterns may be scanned into the registers 110, 112, 114 and 116.

After the patterns have been scanned in, the TAP 106 is used to scan the RUNBIST operation with desired operands into instruction register 122. The RUNBIST operand(s) preferably include a clock control mode. The clock control mode preferably has settings for single step (clock control passes one BIST clock), single phase (clock control passes BIST clock signal until BIST indicates completion of phase), and complete algorithm (clock control passes BIST clock signal until BIST completes).

Once the RUNBIST instruction is scanned into the instruction register, the clock control unit 124 is allowed to pass BIST clock transitions according to the clock control mode specified by the RUNBIST operand(s). The clock control unit 124 may assert the TEST DONE signal when the BIST unit 104 has completed the desired step, phase, or complete algorithm. At the breakpoint, new patterns may be scanned into the boundary scan chain. In this manner, the algorithm performed by the BIST unit may be customized step by step or phase by phase.

It is noted that this customization method allows for the use of existing, hard-wired BIST units that are very fast and require very little area. When operated in the phase mode, the bulk of the BIST operations take place at the BIST clock rate. As these operations require no signals to be driven off-chip, the BIST clock rate is generally allowed to be much higher than the TCK clock rate. Some small overhead is added by the serial scanning of new BIST parameters at the end of each phase, but this is expected to be insignificant. When operated in the step mode, the BIST algorithm can be customized at a fine level. While a greater overhead exists due to the serial scanning of new BIST parameters at each step, operation in this mode is expected to be relatively infrequent. Nevertheless, this mode still benefits from the on-board generation of address and control signals.

It is noted that testing of the memory array 102 can also be performed serially using the boundary scan chain to scan in address, control, and data in signals, and scanning out data out signals for external verification. While very slow, this is testing method is very flexible. The use of the individually accessible portions of the boundary scan chain allows for some elimination of overhead. For example, when the data in remains constant, this register does not have to be refilled on every cycle. Similarly, most BIST algorithms allow the address information to remain unchanged for several cycles.

Numerous variations and modifications will become apparent to those skilled in the art once the above disclosure is fully appreciated. It is intended that the following claims be interpreted to embrace all such variations and modifications.

In an alternate embodiment, gates 312, and 412 of FIGS. 3 and 4 are provided with an additional input signal that is coupled to an "inversion" bit in the instruction register 122. An inversion bit may be provided for each of the following: the Data In register, the Data Out register, and the Read/Write control signal. This embodiment allows a data pattern mask to be scanned into the data registers, and allows easy inversion of the data pattern mask and/or read/write control signal. This inversion is accomplished by scanning a new instruction into the instruction register 122, which requires significantly less time than scanning a new data pattern mask into the data registers. This embodiment is particularly effective for adapting the BIST to provide test algorithms that are related to the original BIST algorithm by selective inversions of the data and read/write operations.

To illustrate the operation of this embodiment, the following example is now provided.

An Efficient Technique for Performing a Fully Customized March Element

At the finest level of customizing a BIST algorithm, we want to be able to generate an arbitrary sequence of read and write operations with a minimum amount of shifts.

The key observation in achieving this goal is that a customized march element(e.g. $\Uparrow(r_{D1}, w_{D2}, w_{D3}, r_{D4},)$) consists of a set of complement components that are: read and write operations, data in and out patterns that are basically belong to a $\{D, \overline{D}\}$ set and a counting direction which is either upward on downward. In other words, all components of a march element can be derived from an initial setting. The initial setting is performed by shifting an initializing vector v into DR. The vector then remains there upon completion of the entire customized march element.

For instance if BIST generates $M:\Uparrow(r_{0000}, w_{1111})$ and we want to replace it with $M':\Downarrow(r_{0101}, w_{1010}, w_{0101}, r_{0101})$, then the initializing vector v is defined as v: 0 0101 1010 111 . . . 1, where the first bit from the left represents a read operation (assuming a read is asserted with 0), the second and third four-bit segments are used to alter the BIST-generated data-in and data-out patterns and the last all-one segment of v is used for reversing the address counting direction. Generating M' involves the following steps:

1. shifting v into data register.
2. $r_{0101}$: applying v.
3. $w_{1010}$: applying v with inverted read/write and data-in fields.
4. $w_{0101}$: applying v with inverted read/write field.
5. $r_{0101}$: appllying v.

As can be seen from the above steps, after shifting v into DR, to complete the march element, all we have to do is to repeat steps 2 to 5 for each memory address.

This testing process can be carried out through instruction register by adding three control bits $^cD_{in}$, $^cD_{out}$, and $^cR/W$ to IR. For instance the procedure of performing a $w_{1010}$ operation is as follows: first TAP controller is derived to Shift-IR state to shift a new instruction that defines the proper setting for v. Then after exiting from Shift-IR state, part of instruction register corresponding to $^cD_{in}$, $^cD_{out}$, $^cR/W$ fields, is set to 101. This means the new test vector which writes a 1010 at a memory address, is formed by inverting $D_{in}$, and read/write fields of the original v. After Update-IR state, control data are latched and the altered test vector v is applied to a memory.

The ability to invert individual segments of a DR(data-in, data-out and control) can be implemented by replacing the XOR2 gates in the modified scan cells with XOR3 gates. The third input for each scan cell is supplied from its corresponding control bit in IR (e.g. $^cD_{in}$, goes to all $D_{in}$, scan cells). The AND gate that controls the Update-DR clock can be eliminated from the modified cell because data, address and control segments do not need to be individually accessible.

By the above technique, every memory operation in a step-by-step testing mode is performed by only shifting a proper instruction to IR. The memory operation is the completed after TAP controller passes the Update-IR state. It should be noticed that the initializing vector v is just shifted once (into DR) for the intire running sequence of a march element. The overhead is significantly less than shifting completet test vectors to DR for each memory operation.

What is claimed is:

1. An integrated circuit device that comprises:
   application logic;
   a built-in self-test (BIST) unit configured to apply test patterns to the application logic to verify functionality of the application logic;
   a boundary scan chain coupled to the application logic and configured to sample input signals to the application logic and control output signals from the application logic;
   a register configured to store a parameter that indicates one operational mode from a set including: step mode, phase mode, and full BIST mode; and
   a test access port configured to provide external access to the boundary scan chain and the register, and configured to control a clock signal to the BIST unit in accordance with the operational mode parameter,
   wherein when the operational mode parameter is set to indicate step mode, the test access port provides only enough clock cycles to the BIST unit for the BIST unit to complete one step of the test pattern each time the test access port enters a Run-BIST state,
   wherein when the operational mode parameter is set to indicate phase mode, the test access port provides only enough clock cycles to the BIST unit for the BIST unit to complete one phase of the test pattern each time the test access port enters a Run-BIST state, and
   wherein when the operational mode parameter is set to indicate full BIST mode, the test access port provides enough clock cycles to the BIST unit for the BIST unit to complete the test pattern.

2. The device of claim 1, wherein one step of the test pattern consists of a plurality of memory accesses to a single memory address.

3. The device of claim 1, wherein one phase of the test pattern consists of a plurality of memory accesses to each memory location.

4. The device of claim 1, wherein the test access port provides external access to at least one individual portion of the boundary scan chain separately from the rest of the boundary scan chain in addition to external access via the boundary scan chain as a whole.

5. The device of claim 1, wherein at least some portion of the boundary scan chain applies a latched inversion mask to signals in a bitwise fashion as the signals are conveyed between the BIST unit and the application logic.

6. The device of claim 1, wherein the application logic includes an array of memory cells.

7. The device of claim 6, wherein the BIST unit includes an address generator for addressing memory locations, and wherein the data input portion of the boundary scan chain is individually accessible via the test access port separately from the rest of the boundary scan chain.

8. An integrated circuit device which comprises:
   application logic;
   a built-in self-test (BIST) unit configured to apply test patterns to the application logic to verify functionality of the application logic;
   a boundary scan chain coupled to the application logic and configured to sample input signals to the application logic and control output signals from the application logic, wherein during operation of the BIST unit, the boundary scan chain is further configured to apply a latched inversion mask to a sequence of address and data bus signals; and
   a test access port configured to provide external access to the boundary scan chain to store the latched inversion mask.

9. The device of claim 8, further comprising:

an instruction register configurable to store a parameter that indicates one operational mode from a set including: step mode, phase mode, and full BIST mode, wherein the test access port is configured to provide external access to the instruction register, and wherein the test access port is configured to control a clock signal to the BIST unit in accordance with the operational mode parameter, wherein when the operational mode parameter is set to indicate step mode, the test access port provides only enough clock cycles to the BIST unit for the BIST unit to complete one step of the test pattern each time the test access port enters a Run-BIST state, wherein when the operational mode parameter is set to indicate phase mode, the test access port provides only enough clock cycles to the BIST unit for the BIST unit to complete one phase of the test pattern each time the test access port enters a Run-BIST state, and wherein when the operational mode parameter is set to indicate full BIST mode, the test access port provides enough clock cycles to the BIST unit for the BIST unit to complete the test pattern.

* * * * *